United States Patent [19]

Erdi

[11] 4,068,254

[45] Jan. 10, 1978

[54] INTEGRATED FET CIRCUIT WITH INPUT CURRENT CANCELLATION

[75] Inventor: George Erdi, Palo Alto, Calif.

[73] Assignee: Precision Monolithics, Inc., Santa Clara, Calif.

[21] Appl. No.: 750,136

[22] Filed: Dec. 13, 1976

[51] Int. Cl.² .............................................. H01L 27/02
[52] U.S. Cl. ...................................... 357/43; 357/22; 357/36; 330/307; 330/227; 330/288; 307/299 B; 307/304
[58] Field of Search ..................... 330/30 D, 22, 38 M; 307/251, 304, 299 B; 357/22, 43, 36

[56] References Cited

U.S. PATENT DOCUMENTS

| | | | |
|---|---|---|---|
| 3,278,853 | 10/1966 | Lin | 357/43 |
| 3,558,921 | 1/1971 | Yokozawa et al. | 307/251 |
| 3,703,650 | 11/1972 | Kendall | 357/43 |
| 4,008,441 | 2/1977 | Schade | 330/22 |
| 4,028,564 | 6/1977 | Streit et al. | 330/38 M |

OTHER PUBLICATIONS

K. Beilstein et al., "Monitor ckt. for Leakage Sensitive FET Devices," IBM Tech. Discl. Bull., vol. 19, No. 3, Aug. 1976, pp. 1000–1001.

Primary Examiner—Stanley D. Miller, Jr.
Assistant Examiner—Joseph E. Clawson, Jr.
Attorney, Agent, or Firm—Poms, Smith, Lande & Glenny

[57] ABSTRACT

An integrated circuit including an FET and an analog for cancelling input current that would otherwise be required to supply the FET gate leakage current. The analog establishes a leakage current the magnitude of which is a substantially fixed proportion of the FET leakage current over a given operating range, and employs proportional current mirror means referenced to the analog leakage current to supply the FET leakage current and thereby substantially cancel the input bias current. In a preferred embodiment the analog comprises a lateral PNP multi-collector transistor with one collector connected to its base to establish a reference current, another collector providing the cancellation current, and its base voltage tracking the FET gate voltage so that the two leakage currents remain substantially equal. An analog FET may also be employed to cancel gate-to-drain and gate-to-source leakages. A description of the invention as applied to an operational amplifier is given.

19 Claims, 4 Drawing Figures

INTEGRATED FET CIRCUIT WITH INPUT CURRENT CANCELLATION

BACKGROUND OF THE INVENTION

This invention relates to integrated circuits, and more particularly to an FET (field effect transistor) assembly adapted to compensate for gate leakage current inherent in the FET and thereby cancel input bias current.

One of the advantages of FET's in applications such as operational amplifiers is that very little input bias current is drawn at room temperature (20° – 25° C). Within this temperature range the input current is typically in the range of 20 to 30 picoamperes. However, the input current has been found to approximately double for every 10° C increase in temperature due principally to increased leakage from the FET gate epitaxial region to its isolation boundary, and can reach 20 to 30 nanoamperes at an ambient temperature of 125° C. In addition, power dissipation in the chip can cause the actual chip temperature to exceed the ambient temperature by up to 30° C, pushing the input current to well over 100 nanoamperes at chip temperatures of 150° C. This is approximately two orders of magnitude worse than the input current characteristic of the better bipolar input operational amplifiers currently available.

SUMMARY OF THE INVENTION

In view of the above problems associated with the prior art, the object of this invention is the provision of a novel and improved integrated circuit assembly which includes an FET and a mechanism for substantially cancelling the large input currents which result from FET gate leakage at elevated temperatures. The achievement of this object is sought with a mechanism that uses a relatively small amount of space on the integrated circuit chip, operates effectively at high temperatures, and does not retard the operation of the overall circuit in which the FET is employed. An additional object is the provision of an operational amplifier which advantageously utilizes such an assembly.

In the realization of these and other objects of the invention, a primary FET is formed on an integrated circuit chip with the epitaxial region of the chip acting as its gate. The FET is set in an isolation pocket having a boundary region formed of opposite conductivity type material from the epitaxial region, so that a leakage current flows from the FET epitaxial material into the pocket boundary when its junction therewith is reverse biased. Means are also provided on the chip to establish a reference current the magnitude of which is a substantially fixed proportion of the FET gate leakage current over a given operating range. A proportional current mirror means tracks the reference current to yield a current which is substantially equal in magnitude to the gate leakage current. The mirror is connected to the FET epitaxial region to supply its leakage current and thereby substantially cancel the input current that would otherwise be required to supply the gate leakage current. With the addition of a second current mirror collector to the analog transistor, the circuit may advantageously be employed in the input state of an operational amplifier to cancel the leakage currents of a pair of input FET's.

In a preferred embodiment the leakage analog comprises a multicollector PNP transistor which utilizes the epitaxial region of a second isolation pocket at its base. The transistor base is connected to one of its collectors to establish the reference current, while another of its collectors is connected to the FET gate to supply the cancellation current. The two collectors are preferably scaled in size so that the analog pocket can be made smaller than the FET pocket. The FET gate and the transistor emitter are coupled by a voltage shifting circuit which holds the base voltage at a level close to but slightly greater than that of the FET gate by an amount sufficient to reverse bias the junction between the cancellation collector and the base.

The transistor, which is located on an isothermal portion of the chip with respect to the primary FET, typically has a gain characteristic which increases with temperature. The transistor is selected such that it produces a cancellation current which substantially cancels the primary FET gate leakage current at elevated temperatures, preferably in the approximate range of 70° – 150° C.

Additional input current cancellation is achieved by adding a second analog device which adds a gate-to-drain leakage component to the reference current. This device comprises a first layer of channel-type material on the epitaxial region of the analog pocket, and a second layer of drain-type material on the first layer. The gate-to-drain leakage of the primary FET is simulated when the second layer is connected in circuit with the negative voltage substrate. A relatively small amount of further input current cancellation is possible, at the cost of greater chip area, by substituting an analog FET for the gate-to-drain analog described above. The analog FET is constructed similar to the primary FET and, in addition to the gate and gate-to-drain leakages described above, adds a relatively small gate-to-source leakage component to the reference current.

DESCRIPTION OF THE DRAWINGS

Further advantages and features of the invention will be apparent to those skilled in the art from the ensuing detailed description thereof, taken together with the accompanying drawings, in which.

DETAILED DESCRIPTION OF A PREFERRED EMBODIMENT

Figure 1:
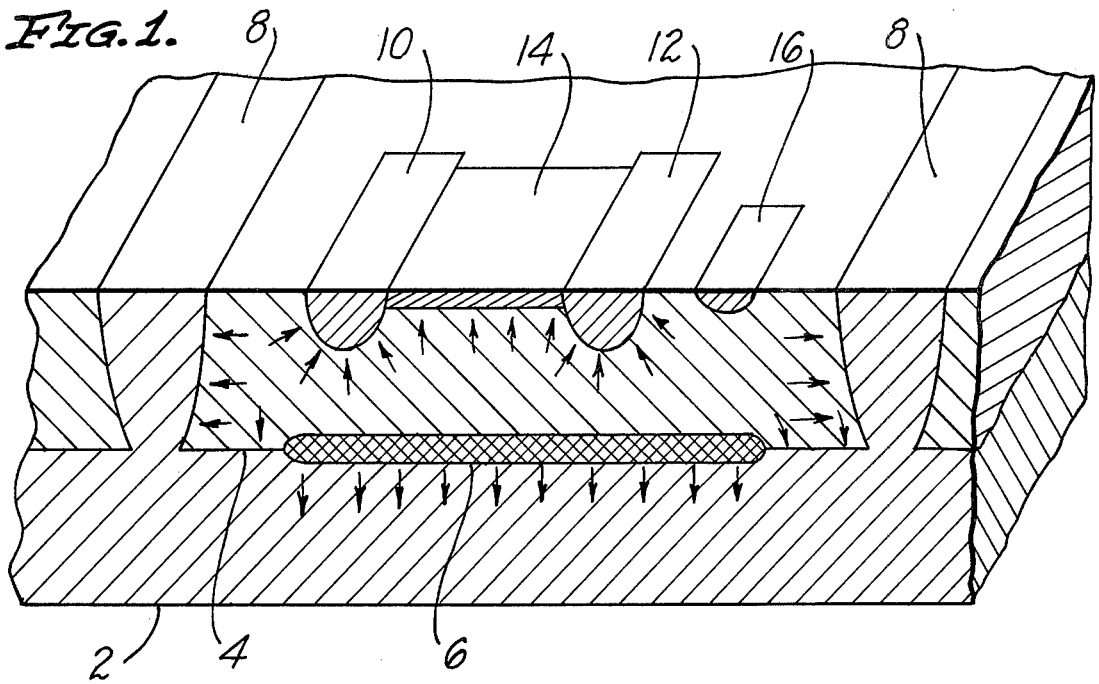
FIG. 1 is an off-scale, cross-sectional perspective illustration of an FET constructed on an integrated circuit chip.

A cross-sectional view of a typical FET formed on an integrated circuit chip is shown in FIG. 1. The chip includes a substrate 2 of P-type material upon which is formed an epitaxial region 4 of N-type material. A buried layer 6 formed from highly doped N-type material is provided along the interface of the substrate and epitaxial region underlying the active FET components. An isolation wall 8 of the same type conductivity material as substrate 2 extends through the epitaxial region to surround the FET site. Isolation wall 8 together with substrate 2 forms the boundary region of a pocket which electrically isolates the FET from adjacent components.

The FET itself includes a source 10 and a drain 12, both of which are formed from P-type material diffused into the epitaxial region. Distributed between and contacting both of these elements is a channel 14 of lightly doped P-type material which bears the FET current. The gate comprises the epitaxial material underlying channel 14 between source 10 and drain 12. A gate contact 16 formed from heavily doped N-type material is set into the epitaxial region and imparts a bias voltage through the epitaxial region to buried layer 6. The voltage is transmitted laterally by the buried layer and then back through the epitaxial region to channel 14, which in turn controls current flow between source 10 and drain 12 in accordance with the well-known FET mode of operation. Contacts (not shown) are formed respectively over source 10, drain 12, and gate contact 16 for connecting the FET to other components on the chip. A protective oxide coating, also not shown, is normally provided to protect those portions of the pocket where contact with underlying elements is not made.

The dimensions shown in the figure are compressed laterally to a considerable extent. In practice the distance between isolation walls 8 would typically be in the order of 100 to 250 microns, while the thickness of the chip from buried layer 6 to the top of epitaxial region 4 would be about 15 microns.

Figure 2:
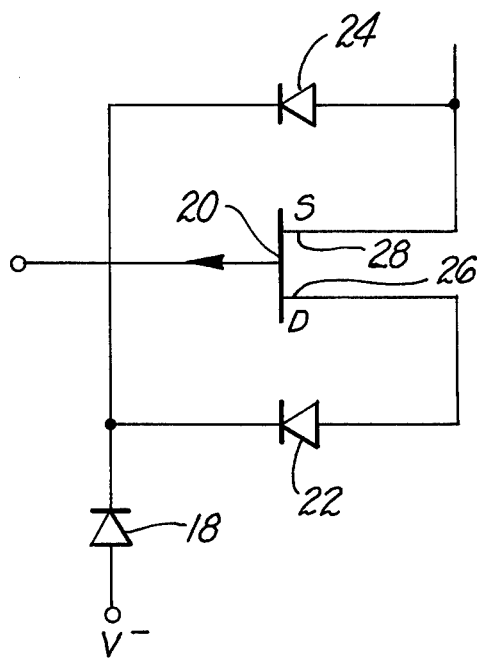
FIG. 2 is a circuit diagram showing the equivalent leakage circuits associated with the FET of FIG. 1.

Substrate 2 is tied to a low voltage supply to prevent the epitaxial/substrate junctions from forward biasing. This gives rise to a large gate leakage current at elevated temperatures, frequently in the order of hundreds of nanoamperes for an operating temperature of 150° C, from the epitaxial region through buried layer 6 to substrate 2 and to isolation walls 8. In addition, lesser leakage currents flow from the epitaxial region into both source 10 and drain 12, and also into channel 14. Since the leakage into the channel is determined in part by the voltage distributed across the channel, which in turn is determined by the voltage levels of source 10 and drain 12, part of the channel may be treated as contributing to the drain leakage and the remainder of the channel to the source leakage. All of these leakage currents are indicated by arrows in FIG. 1, and by the equivalent circuit of FIG. 2. In this circuit the epitaxial (gate)/isolation junction is represented by a diode 18 connected to pass reverse bias current from the FET gate 20 to the negative voltage supply. The gate-to-drain and gate-to-source leakage paths (including their respective channel components) are represented by diodes 22 and 24 connected to conduct reverse bias current from gate 20 to drain 26 and source 28, respectively. In relative magnitudes the leakage currents due to each of these three junctions are approximately as follows:
gate-to-pocket: 90%
gate-to-drain: 9%
gate-to-source: 1%

The magnitude of the leakage currents is generally dependent upon temperature, the area of the junctions involved, the N and P concentrations of the various materials, and the voltage levels of each of the FET components. In general terms, the present invention provides a solution for the leakage current problems at high temperatures by means of an analog which is tied to the FET so as to set up an analog leakage current which tracks specified components of the FET leakage current. A current mirror mirrors the analog leakage current and is connected to the FET so as to supply its gate leakage current from the analog, thereby cancelling the input current that would otherwise have been required to supply the gate leakage current. In order to save space on the chip, the analog and its leakage current are smaller than the FET and its leakage current by a certain proportion. The current mirror then amplifies the mirrored current until it is large enough to cancel out the specified FET leakage.

Figure 3:
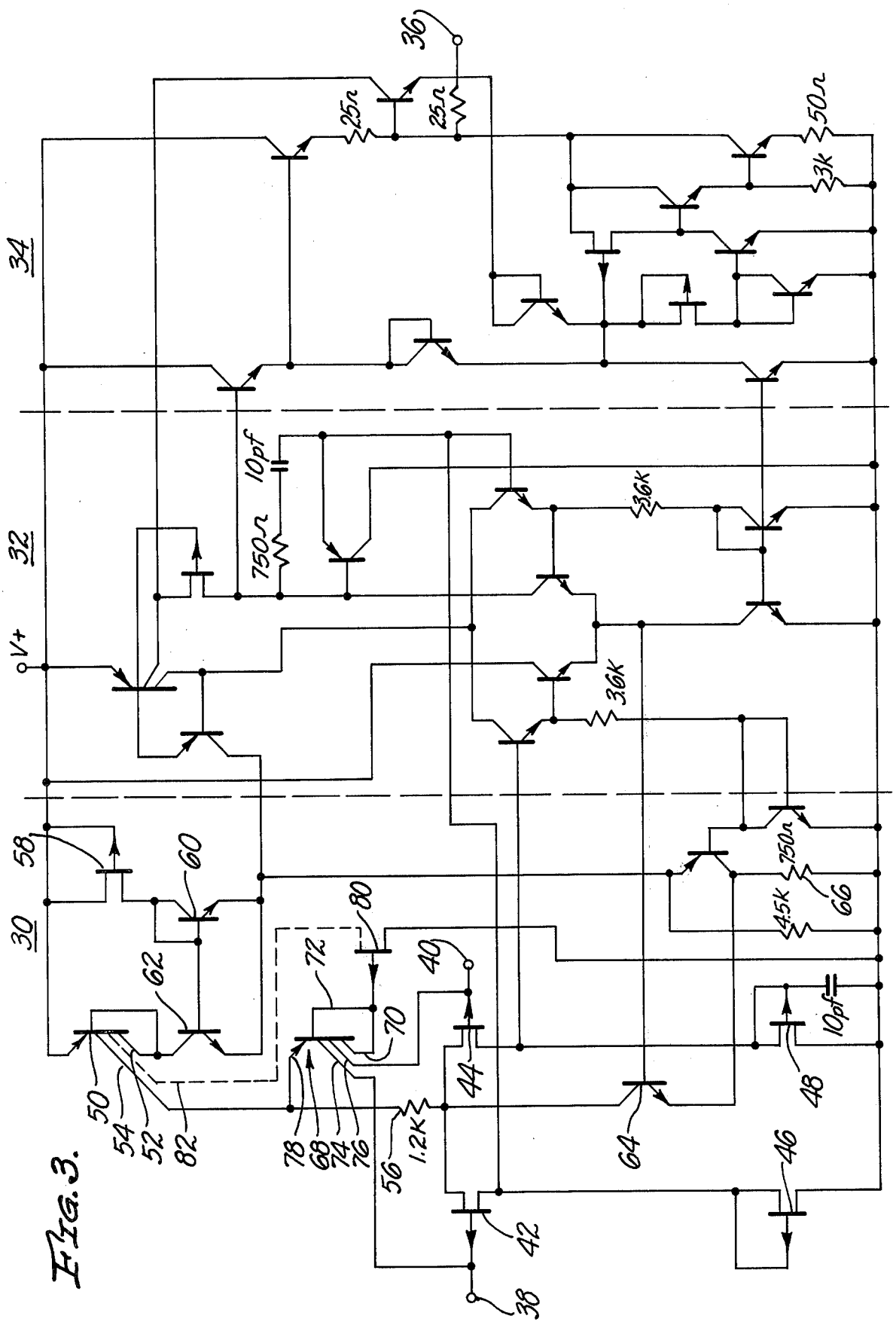
FIG. 3 is a circuit diagram of a two-stage operational amplifier which employs the present invention.

FIG. 3 is a schematic diagram of an operational amplifier having an input stage 30, a second stage 32, and an output stage 34. The latter two stages are conventional and need not be described in detail herein; suffice it to say that, after an initial amplification by a factor of approximately 200 at input stage 30, an input signal is again amplified by a factor of approximately 1,000 in a second stage 32. Output stage 34 provides a low output impedance which permits a current up to 10 milliamps to be delivered to a load connected at output terminal 36.

Referring now to input stage 30, input terminals 38 and 40 are connected respectively to the gates of a pair of input FET's 42 and 44. The drains of the input FET's are connected through second amplifier stage 32 to a negative voltage supply bus, normally held at −15 volts, and are maintained at approximately two volts above the bus voltage. The input FET operating currents are established by FET current sources 46 and 48. A multicollector PNP transistor 50 has its emitter connected to a positive 15 volt supply bus and one of its collectors 52 tied to its base. The other collector 54 mirrors the current in collector 52 and amplifies it by a factor of three so as to function as a current source and deliver a current of about 470 microamperes. Collector 54 is connected through a 1.2 kiloohm resistor 56 to the sources of input FET's 42 and 44. The operating current of current mirror 50 is established by the turn-on circuit of a current source FET 58 and a degenerated current mirror formed by transistors 60 and 62. An additional transistor 64 has its collector connected to the FET sources and its emitter connected through a resistor 66 to the negative voltage supply. Transistor 64 provides a common mode feedback escape path for any current produced by current source 50 in excess of the current drawn through the input FET's by load FET's 46 and 48. The remainder of the amplifier circuit depicted in FIG. 3 is conventional and need not be described in detail herein.

As described thus far, input FET's 42 and 44 will draw an undesirably high level of input current at high temperatures due to their gate leakage currents, as described above. To compensate for this leakage current, a multicollector lateral PNP transistor 68 is formed on the integrated circuit chip with a first collector 70 connected back into its base 72, a second collector 74 connected to the gate of input FET 42, a third collector 76 connected to the gate of input FET 44, and its emitter 78 connected between resistor 56 and current source collector 54. Base 72 is floating, its only bias being the epitaxial to substrate leakage. As will be described in further detail hereinafter, transistor 68 is formed in a pocket separate from input FET's 42 and 44, with its base comprising the portion of the epitaxial region between its emitter and collectors. The transistor is formed on the chip on an isothermal line with input FET's 42 and 44 and, since the doping of its epitaxial region is the same as the doping of the FET epitaxial regions, its base leakage current in relation to the FET gate leakage currents is determined primarily by the following two factors: (a) the relation with respect to the negative voltage supply between the transistor base voltage and the FET gate voltages, and (b) the interface area between the base epitaxial region and its pocket relative to the interface areas between the FET epitaxial regions and their respective pockets.

Regarding the first of these factors, the base voltage of transistor 68 is kept at a level close to the gate voltages of FET's 42 and 44 by the voltage drop across resistor 56 and tracks the common-mode input voltage applied to the operational amplifier. With a current of 470 microamps from current source collector 54, the voltage drop across resistor 56 will be about 560 millivolts for a resistance value of 1.2 kiloohms. The manner in which the transistor base voltage tracks the input FET gate voltage will now be traced. Beginning with the FET gates, there is typically a 100 - 200 millivolt drop from the gates to the sources at the operating current levels established by FET's 46 and 48. This is followed by a 564 millivolt rise from the FET sources to transistor emitter 78. Another drop of about 250 millivolts at the operating levels contemplated for the circuit is encountered between emitter 78 to base 72. The base voltage is thus fixed at a level approximately 100 to 200 millivolts above that of the FET gates. (In an operational amplifier substantially the same voltage is present at both inputs). While ideally the base and gate voltages would be equal, in practice the base voltage must be kept slightly above the gate voltages in order to prevent the junction between base 72 and collectors 74 and 76 from forward biasing and drawing current away from the gates.

Given equal temperatures, equal doping levels, and approximately equal voltages, the transistor base and FET gates should exhibit substantially equal leakage currents if the areas of interface with their respective isolation pockets are also equal. In order to conserve space on the chip, however, the pocket for transistor 68 is preferably made considerably smaller than the pockets for FET's 42 and 44, with collector area scaling used to make up the difference. The leakage cancellation circuit described thus far effectively cancels the approximately 90% of total leakage current attributable to gate leakage from the epitaxial region to the boundary of the isolation pocket. It will be remembered, however, that some 9% of the total leakage current results from reverse bias current flow from the epitaxial region to the FET drain, and 1% to the source. An additional element employed to compensate for the gate-to-drain leakage is indicated in FIG. 3 by FET symbol 80. While an actual FET could be used to recreate the lesser leakages, element 80 is a gate-to-drain analog which saves area on the chip and simplifies its construction by simulating the gate-to-drain leakage without reproducing an entire FET. It consists of an ion-implanted channel area and a drain area diffused into the channel. The drain area occupies the same space as the input FET drains, scaled down by the amplification factor between collector 70 and the other collectors of transistor 68, while the channel area occupies one-half of the output FET channel areas, scaled down by the same factor. (It will be recalled that approximately one-half the areas of the input FET channels are influenced primarily by the drain voltage level for leakage current purposes, and may be allocated to the drain in establishing a leakage analog). The epitaxial material within the isolation pocket serves as the gate of the analog FET as well as the base of transistor 68, while the analog drain is connected for convenience directly to the negative voltage supply bus, i.e., the substrate. This latter connection introduces an error in the analog leakage, since the input FET drains are held at about 2 volts above the negative supply voltage. This error can be compensated for by an adjustment in the scaling of analog element 80.

As an alternate to the gate-to-drain simulation just described, analog device 80 may comprise an actual FET with its gate and drain connected the same as the simulated device, and its source connected to an additional current source collector 82 of transistor 50 as indicated by a dashed line. The device thus compensates for gate-to-source as well as gate-to-drain leakages. However, since this alternate embodiment requires more chip area and accounts for only about 1% greater accuracy in cancelling input current, it may be desirable only when a very high degree of input current cancellation is required.

Figure 4:
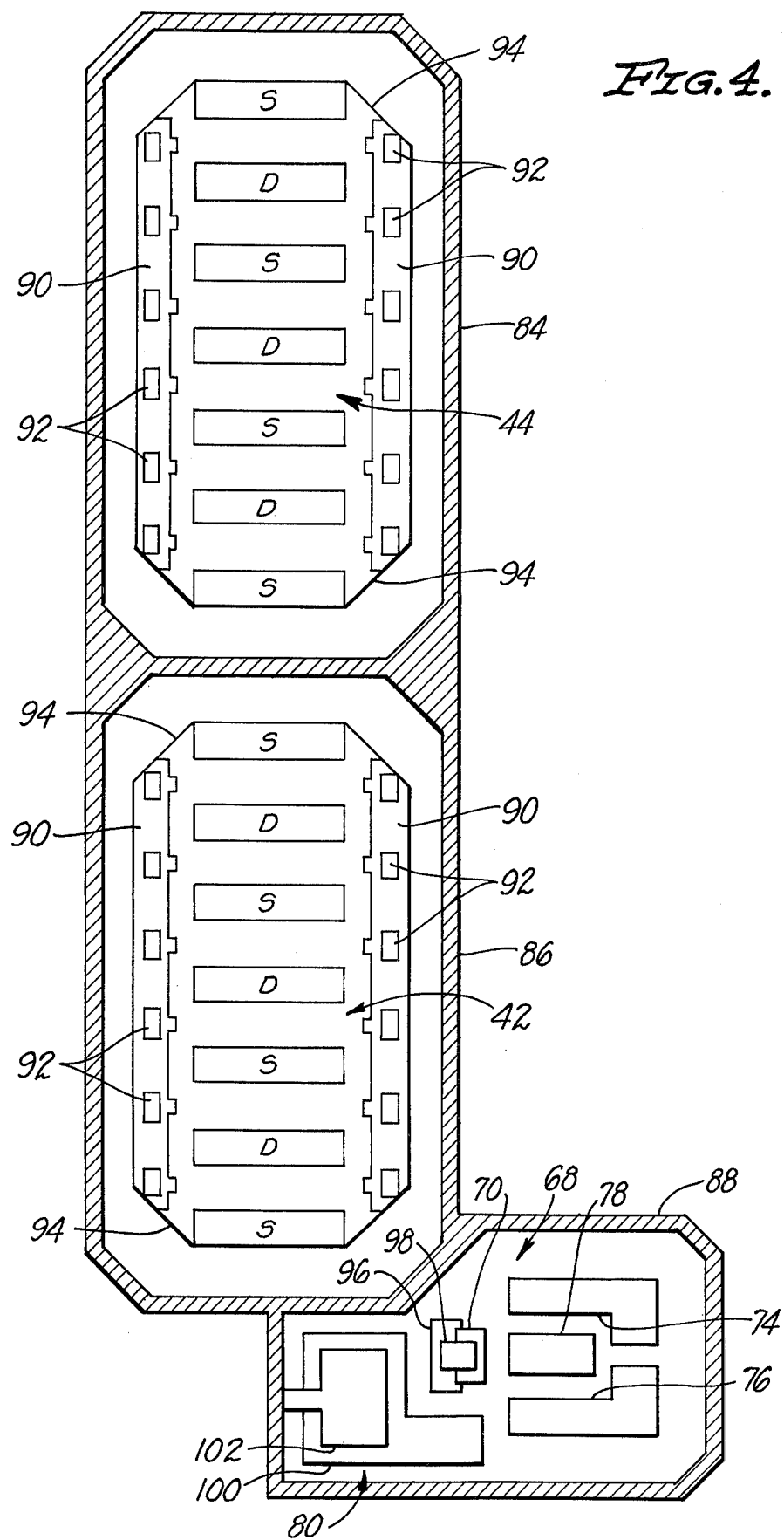
FIG. 4 is a plan view showing the layout of various components of the circuit of FIG. 3 on an integrated circuit chip.

In FIG. 4 the layout of the above components on the chip surface is illustrated. Input FET's 42 and 44 are located in isolation pockets 84 and 86 respectively, while transistor 68 is in isolation pocket 88, isolation material being indicated by cross hatching. The source for each FET comprises a plurality of spaced diffusion strips labeled "S" in the figure and electrically tied together, while each of the drains comprises a plurality of diffusion strips interspersed between the source strips and labeled "D". The gate contact for each FET comprises a pair of highly doped N-type strips 90 arranged along opposite sides of the source and drain strips, each gate contact strip being provided with a contact 92 between successive source and drain strips. The area between the source and drain strips enclosed by boundary line 94 is the ion-implanted channel.

Distributed around emitter 78 of transistor 68, and spaced therefrom by the epitaxial region which forms the transistor base, are collectors 70, 74 and 76. Collector 70 is shorted to an epitaxial contact 96 by a metallic layer 98. The areas of collectors 74 and 76 which face emitter 78 are each larger than the corresponding area of collector 70 facing emitter 78 by a factor of 2.3, causing the currents through collectors 74 and 76 (excluding base current errors in the current mirror) to be amplified with respect to the current through collector 70 by the same factor. With the base current included, the amplification factor is 2.0. Also isolated within pocket 88 is gate-to-drain analog 80, comprising ion-implanted channel area 100 and drain simulation area 102 shorted to the isolation boundary.

As can be seen, the isolation pockets for FET's 42 and 44 are each considerably larger than the pocket for transistor 68 and analog 80. The current amplification of collectors 74 and 76 should compensate for the reduced size of the transistor pocket, the net result being that the currents through the collectors approximate in magnitude the gate and gate-to-drain leakage currents of FET's 42 and 44. This result cannot be achieved for all temperatures, however, since the total analog leakage current is divided between collector 70 and base 72 of transistor 68, while only that portion of the current which is directed through collector 70 serves as a reference to be proportionately mirrored by the cancellation currents in the other two collectors. As the collector 70 current increases absolutely with increasing temperature to supply the additional base leakage current at higher temperatures, it also increases in relative terms compared with the base current. This in effect is an increase in the transistor current gain (beta) as the operating current increases from a few picoamperes to nanoamperes, and is reflected in cancellation currents through collectors 74 and 76 that increase with temperature at a faster rate than the transistor leakage current.

Beta is relatively independent of collector current when the collector current exceeds approximately 500 picoamperes. However, beta decreases at less than 500 picoamperes and the base current error becomes significant, resulting in undercancellation of the input FET gate current. The physical dimensions of the various components of transistor 68 are therefore preferably selected such that the currents through collectors 74 and 76 equal the FET leakage currents at the elevated temperature range, typically between 70° and 150° C, at which input current cancellation becomes critical. A considerable error is introduced in the cancellation current at lower temperatures, but the absolute current magnitudes at these temperatures are low enough that the error is not of much significance. To achieve such a temperature compensated cancellation current in the circuit shown with the aforesaid collector ratio of 2.3, the ratio of the epitaxial/pocket interface area for FET's 42 and 44 to the corresponding interface area for transistor 68 is 2.0.

Referring back to FIG. 3, the operation of the leakage current cancellation circuit can now be summarized. With an input signal appearing at the gates of FET's 42 and 44, the gate epitaxial regions will leak a certain amount of current to the boundary regions of their respective isolation pockets. The input voltages are reflected through the FET source/gate junctions, resistor 56, and the base/emitter junction of transistor 68 to establish a closely related but slightly higher voltage at the transistor epitaxial region. This in turn produces a reverse bias leakage current to the boundary region of the transistor isolation pocket, the magnitude of which is related to the FET leakage currents by the ratio between their respective pocket sizes. Most of the transistor base leakage current is supplied through collector 70 and the remainder through base 72, the exact ratio between the two leakage components being determined by the transistor gain at the operating collector current level. Also included in the collector 70 current is the gate-to-drain leakage component supplied by analog device 80. The current through collector 70 is mirrored by collectors 74 and 76 and amplified in accordance with the ratio between collector areas, such that cancellation currents are delivered from collectors 74 and 76 respectively to the gates of FET's 42 and 44 in amounts sufficient to substantially cancel the leakage currents of those FET's. As a result, the input current required to supply the leakage is reduced to a small value, with the accuracy of the cancellation progressively increasing as the leakage problem becomes greater at higher temperatures.

It should be noted that, due to capacitances associated with transistor 68, the cancellation circuit has a fairly slow response characteristic and is not effective in cancelling the FET leakage currents during an initial transient period preceding relatively steady state signals at the inputs to FET's 42 and 44. However, due to input capacitances associated with the amplifier during fast slewing transient conditions at its inputs, the input current for such conditions is generally in the microampere range and the additional input current resulting from uncancelled leakage current is not critical. Since it is kept out of the signal path, transistor 68 will not slow down the amplifier response time for such transient conditions; it merely leaves the leakage currents mostly uncancelled.

Particular embodiments of the invention have been shown and described. It should be understood, however, that numerous additional modifications and variations are possible in light of the above teachings. It is therefore intended that the scope of the invention be limited only in and by the terms of the appended claims.

What is claimed is:

1. A leakage compensated FET integrated circuit assembly, comprising:
   an integrated circuit chip having a substrate and an epitaxial region,
   a primary FET on said chip comprising a source, a drain, a channel, and a gate, said source and drain comprising mutually spaced means formed on a portion of said epitaxial region and connected by said channel, and said gate comprising said epitaxial portion,
   an isolation pocket for said FET having a boundary region which comprises the portion of the substrate adjacent said epitaxial portion together with isolation means extending into said epitaxial region to isolate the FET portion thereof, said substrate and isolation means being of opposite conductivity type material from said epitaxial region and drawing a gate leakage current therefrom when said epitaxial region is reverse biased with respect to said substrate and isolation means, and
   a leakage analog to said FET, comprising means on said chip to establish a reference current the magnitude of which is a substantially fixed proportion of the gate leakage current from said FET to said first pocket over a given operating range, and proportional current mirror means tracking said reference current to provide a current substantially equal to said FET leakage current,
   said proportional current mirror means being connected to the FET epitaxial region to supply the gate leakage current thereof and thereby substantially cancel the FET input current that would otherwise be required to supply said leakage current.

2. The integrated circuit assembly of claim 1, said leakage analog comprising the combination of a second isolation pocket, and component means in said second pocket adapted to establish a reference leakage current to said second pocket.

3. The integrated circuit assembly of claim 2, wherein said analog component means comprises a multicollector transistor, said transistor utilizing the epitaxial region within said second isolation pocket as a base, a first one of said collectors being connected to the transistor base to establish said reference current, a second one of said collectors proportionately mirroring said reference current and being connected to the FET gate to provide cancellation current thereto, and means limiting the voltage level at the transistor base to an amount close to the voltage level at the FET gate.

4. The integrated circuit assembly of claim 3, the effective area of said second collector being scaled greater than the effective area of said first collector, whereby the reference current is amplified in said second collector, and the analog pocket occupies a smaller space on said chip than does said FET pocket.

5. The integrated circuit assembly of claim 4, said analog pocket further including a drain leakage analog which comprises a first layer of channel-type material on the epitaxial region of said analog pocket, and a second layer of drain-type material diffused into the channel, said second layer being connected in circuit with the substrate, the dimensions of said drain leakage analog being selected to produce a leakage current thereto from the epitaxial region of said analog pocket which is related to the drain leakage current of said primary FET by substantially the scaling ratio between said first and second transistor collectors, whereby the analog drain leakage current is included in said reference current to compensate for the primary drain leakage current.

6. The integrated circuit assembly of claim 3, and further including an analog FET in said analog pocket, said analog FET having a substantially similar construction to said primary FET so as to establish gate-to-drain and gate-to-source leakage currents the magnitudes of which are substantially fixed proportions of the corresponding leakage currents for said primary FET, the gate of said analog FET being connected to the base of said multicollector transistor so that said gate-to-drain and gate-to-source leakage currents are included in said reference current.

7. The integrated circuit assembly of claim 3, said analog transistor current mirror having a gain characteristic which is dependent upon operating current and increases with increasing temperature, wherein said transistor is selected to produce a cancellation current which is insufficient at room temperature but sufficient at a predetermined higher temperature to substantially cancel the primary FET leakage current.

8. The integrated circuit assembly of claim 7, wherein said predetermined higher temperature is in the approximate range of 70° – 150° C.

9. The integrated circuit assembly of claim 2, said primary FET and leakage analog being constructed on substantially isothermal portions of said chip so as to minimize errors in leakage current due to temperature differentials.

10. A leakage compensated FET integrated circuit assembly, comprising:
an integrated circuit chip having a P-type substrate and an N-type epitaxial region,
a primary FET on said chip comprising a source, a drain, a channel, and a gate, said source and drain comprising mutually spaced means formed on a portion of said epitaxial region and connected by said channel, and said gate comprising said epitaxial portion,
an isolation pocket for said FET having a boundary region which comprises the portion of the substrate adjacent said epitaxial portion together with isolation means extending into said epitaxial region to isolate the FET portion thereof, said substrate and isolation means being of opposite conductivity type material from said epitaxial region and drawing a gate leakage current therefrom when said epitaxial region is reverse biased with respect to said substrate and isolation means,
a leakage analog to said FET comprising a second isolation pocket, a multicollector lateral PNP transistor in said pocket employing the epitaxial region of said second pocket for a base, a first one of its collectors being connected to its base to establish a reference leakage current to said pocket the magnitude of which is a substantially fixed proportion of the gate leakage current from said FET to said first pocket over a given operating range, and a second one of its collectors forming a proportional current mirror tracking said reference current and connected to the FET epitaxial region to supply a current thereto which is substantially equal to the FET gate leakage current, thereby substantially cancelling the FET input current that would otherwise be required to supply said leakage current, and
voltage shifting means coupling the gate of said FET with the emitter of said transistor to maintain the base voltage level close to but greater than that of the gate by an amount sufficient to keep the junction between the second collector and the base of said transistor reverse biased.

11. The integrated circuit assembly of claim 10, wherein said voltage shifting means comprises the combination of a resistance means connected between the FET source and the transistor emitter, and a current source means connected to transmit a substantially constant current through said resistance means.

12. The integrated circuit assembly of claim 10, wherein the effective area of said second collector is scaled greater than the effective area of said first collector, thereby amplifying the reference current and enabling said analog pocket to occupy a smaller space on said chip than said FET pocket.

13. In an integrated circuit operational amplifier, a leakage compensated input stage comprising:
an integrated circuit chip having a substrate adapted to be connected to a negative supply voltage, and an epitaxial region formed on the substrate,
input stage circuit means including first and second substantially identical primary FET's, each of said FET's comprising a source, a drain, a channel, and a gate, the source and drain for each FET comprising mutually spaced means formed on said epitaxial region and connected by said channel, and the gate for each FET comprising the portion of the epitaxial region adjacent said channel,
an isolation pocket for each of said FET's, each of said pockets having a boundary region which comprises isolation means extending into the epitaxial region to laterally isolate its respective FET, and the portion of the substrate adjacent the FET, said substrate and isolation means being of opposite conductivity type material from said epitaxial region and drawing gate leakage currents from the FET portions thereof when said portions are reverse biased with respect to said substrate and isolation means,
amplifier input terminals associated with each of said FET gates,
a leakage analog associated with each FET, each analog comprising means on said chip for establishing a reference current the magnitude of which is a substantially fixed proportion of the gate leakage current of its associated FET, and proportional current mirror means tracking said reference current to provide a current which is substantially equal to the gate leakage current of its associated FET,
each of said proportional current mirror means being connected to the epitaxial region of its associated FET to supply the gate leakage current thereof and thereby substantially cancel the input current that would otherwise be required to supply said leakage current.

14. The apparatus of claim 13, wherein the current mirror for each FET is referenced to a common reference current.

15. The apparatus of claim 14, wherein the leakage analog for both FET's comprises a single analog isolation pocket, a triple collector transistor formed within said pocket and utilizing the epitaxial region thereof as a base, a first one of said collectors being connected to the transistor base to establish said common reference current, the second and third ones of said collectors proportionately mirroring said reference current and connected respectively to the gates of said first and second FET's to provide said cancellation currents thereto, and means limiting the voltage level at the transistor base to an amount close to the voltage level at the amplifier input terminals.

16. The apparatus of claim 15, wherein the effective areas of said second and third collectors are each scaled greater than the effective area of said first collector to amplify the current in said second and third collectors with respect to the reference current, thereby enabling the analog pocket to occupy a smaller space on said chip than either of said FET pockets.

17. The integrated circuit assembly of claim 16, said analog pocket further including a drain leakage analog which comprises a first layer of channel-type material on the epitaxial region of said analog pocket, and a second layer of drain-type material diffused into the channel, said second layer being connected in circuit with the substrate, the dimensions of said drain leakage analog being selected to produce a leakage current thereto from the epitaxial region of said analog pocket which is related to the drain leakage currents of said primary FET's by substantially the scaling ratio between said first and second transistor collectors, whereby the analog drain leakage current is included in said reference current to compensate for the primary drain leakage currents.

18. The apparatus of claim 15, and further including an analog FET in said analog pocket constructed substantially similar to each of said primary FET's so as to establish gate-to-drain and gate-to-source leakage currents the magnitudes of which are substantially fixed proportions of the corresponding leakage currents for said primary FET's, the gate of said analog FET being connected to the base of said multicollector transistor so that said gate-to-drain and gate-to-source analog leakage currents are included in said analog reference current.

19. The apparatus of claim 15, wherein said voltage limiting means comprises the combination of a resistance means connected on one side to the source of each of said FET's and on the other side to the emitter of said analog transistor, and a current source means connected to transmit a substantially constant current through said resistance means, the magnitude of said current and the resistance value of said resistance means being selected to produce a predetermined voltage drop across said resistance means, the size of said voltage drop being sufficient to maintain the transistor base voltage level close to the voltage level at the source of each FET, but greater than said source voltage level at an amount sufficient to reverse bias the junctions between the base of the transistor and its second and third collectors.

* * * * *

UNITED STATES PATENT AND TRADEMARK OFFICE
CERTIFICATE OF CORRECTION

PATENT NO. : 4,068,254
DATED : January 10, 1978
INVENTOR(S) : Erdi, George

It is certified that error appears in the above—identified patent and that said Letters Patent are hereby corrected as shown below:

Column 5, line 56, "output" should be changed to --input--.

Signed and Sealed this

Second Day of May 1978

[SEAL]

Attest:

RUTH C. MASON
Attesting Officer

LUTRELLE F. PARKER
Acting Commissioner of Patents and Trademarks